(12) United States Patent
Lv

(10) Patent No.: US 10,141,767 B2
(45) Date of Patent: Nov. 27, 2018

(54) MICROPROJECTION DEVICE AND MAGNETIC SUSPENSION BASE

(71) Applicant: BOE Technology Group Co., Ltd., Beijing (CN)

(72) Inventor: Xuewen Lv, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 661 days.

(21) Appl. No.: 14/564,935

(22) Filed: Dec. 9, 2014

(65) Prior Publication Data
US 2016/0064989 A1   Mar. 3, 2016

(30) Foreign Application Priority Data

Aug. 29, 2014   (CN) .......................... 2014 1 0438074

(51) Int. Cl.
*H02J 7/00*   (2006.01)
*H02J 7/02*   (2016.01)
(Continued)

(52) U.S. Cl.
CPC ................ *H02J 7/025* (2013.01); *F16B 1/00* (2013.01); *F16M 13/022* (2013.01);
(Continued)

(58) Field of Classification Search
CPC ...... H02J 7/025; H02J 7/0052; H05K 5/0204; F16M 13/022; H01F 7/0278; H01F 7/20;
(Continued)

(56) References Cited

U.S. PATENT DOCUMENTS

| | | | |
|---|---|---|---|
| 2007/0170798 A1* | 7/2007 | Gohin | H02N 15/00 310/90.5 |
| 2008/0218929 A1* | 9/2008 | Davis | A63H 33/26 361/144 |

(Continued)

FOREIGN PATENT DOCUMENTS

| | | |
|---|---|---|
| CN | 1476158 A | 2/2004 |
| CN | 1729614 A | 2/2006 |

(Continued)

OTHER PUBLICATIONS

Levitron, https://www.real-world-physics-problems.com/levitron.html, wayback mahine Jul. 9, 2014.*

(Continued)

*Primary Examiner* — Nha Nguyen
(74) *Attorney, Agent, or Firm* — Banner & Witcoff, Ltd.

(57) ABSTRACT

A microprojection device and a magnetic suspension base are provided. The microprojection device comprises a microprojector and a main suspension magnet. The microprojector is fixed to the main suspension magnet. The magnetic field direction at a magnetic field center of the main suspension magnet is in the vertical direction so the microprojector can be driven to be suspended in a magnetic field environment. The magnetic suspension base comprises: a housing and at least three base magnets disposed therein. The magnetic field direction at the center of a combined magnetic field formed by the at least three base magnets is in the vertical direction; the magnetic intensity at the center of the combined magnetic field is less than the magnetic intensity near the base magnets; and the microprojector can be driven to be suspended under the magnetic field environment by being fixed on the magnet.

8 Claims, 4 Drawing Sheets

(51) Int. Cl.
    *G03B 21/14*     (2006.01)
    *F16B 1/00*     (2006.01)
    *F16M 13/02*     (2006.01)
    *H01F 7/02*     (2006.01)
    *H01F 7/20*     (2006.01)
    *H05K 5/02*     (2006.01)

(52) U.S. Cl.
    CPC ........... *G03B 21/14* (2013.01); *G03B 21/145* (2013.01); *H01F 7/0278* (2013.01); *H01F 7/20* (2013.01); *H02J 7/0052* (2013.01); *H05K 5/0204* (2013.01); *F16B 2001/0035* (2013.01)

(58) Field of Classification Search
    CPC .... F16B 1/00; F16B 2001/0035; G03B 21/14; G03B 21/145
    See application file for complete search history.

(56) References Cited

U.S. PATENT DOCUMENTS

| | | | | |
|---|---|---|---|---|
| 2015/0334480 | A1* | 11/2015 | Yang | H04R 1/028 381/394 |
| 2017/0201194 | A1* | 7/2017 | Hahn | H02N 15/00 |

FOREIGN PATENT DOCUMENTS

| | | |
|---|---|---|
| CN | 200977868 Y | 11/2007 |
| CN | 102055382 A | 5/2011 |
| CN | 202268750 U | 6/2012 |
| CN | 202957914 U | 5/2013 |
| CN | 103312233 A | 9/2013 |
| CN | 203732867 U | 7/2014 |
| JP | 2012127489 A | 7/2012 |
| KR | 1020130127095 A | 11/2013 |
| WO | 2004/030198 A2 | 4/2004 |

OTHER PUBLICATIONS

Nov. 29, 2016—(KR) Final Korean Office Action Appn 10-2015-0067237 with English Tran.
Jan. 18, 2016—Extended European Search Report Application 15165051.2.
Jul. 28, 2015—(CN)—First Office Action Appn 201410438074.3 with English Tran.
Jan. 4, 2016—(CN)—Second Office Action Appn 201410438074.3 with English Tran.
Dec. 17, 2012—Tencent, <http://tech.qq.com/a/20121217/000029.htm#p=31>, with English Tran.
May 12, 2016—(KR)—Office Action Appn 10-2015-0067237 with English Tran.
Jun. 15, 2016—(CN)—Third Office Action Appn 201410438074 with English Tran.
Aug. 28, 2017—(KR) Third Korean Office Appn 10-2015-0067237 with English Tran.

* cited by examiner

MICROPROJECTION DEVICE AND MAGNETIC SUSPENSION BASE

This application claims priority to Chinese Patent Application No. 201410438074.3, filed on Aug. 29, 2014. The present application claims priority to and the benefit of the above-identified application and is incorporated herein in its entirety.

TECHNICAL FIELD

Embodiments of the present disclosure relate to a microprojection device and a magnetic suspension base.

BACKGROUND

With the development of the wearable technologies and microprojector technologies, it has been proposed to provide a microprojector on a finger ring, namely a ring projector (hereinafter referred to as "projection ring") has been proposed. Moreover, in order to achieve better user experience, it has been proposed to arrange a magnetic suspension base for the projection ring, but nobody has provided a specific implementation proposal.

SUMMARY

An embodiment of the disclosure provides a microprojection device, comprising a microprojector and a main suspension magnet; the microprojector is fixed to the main suspension magnet; and a magnetic field direction at a magnetic field center of the main suspension magnet is in a vertical direction, so that the microprojector can be driven to be suspended in a magnetic field environment.

For example, in an embodiment, the main suspension magnet is provided with a counterweight.

For example, in an embodiment, the microprojection device further comprises at least one auxiliary magnet disposed on the microprojector or the counterweight; a straight line in which the magnetic field direction at a magnetic field center of each auxiliary magnet is disposed is perpendicular to a straight line in which the magnetic field direction at the magnetic field center of the main suspension magnet is disposed.

For example, in an embodiment, a wireless charging receiver is disposed in the microprojector.

Another embodiment of the disclosure provides a magnetic suspension base, comprising: a housing and at least three base magnets disposed in the housing. A magnetic field direction of a center of a combined magnetic field formed by the at least three base magnets is in a vertical direction; and magnetic intensity at the center of the combined magnetic field is less than magnetic intensity of the combined magnetic field near the base magnets.

For example, in an embodiment, all the base magnets are uniformly arranged in the housing.

For example, in an embodiment, four base magnets are disposed in the housing.

For example, in an embodiment, the main suspension magnet is provided with a counterweight; at least one auxiliary magnet is disposed on the microprojector or the counterweight; and a straight line in which the magnetic field direction at a magnetic field center of each auxiliary magnet is disposed is perpendicular to a straight line in which a magnetic field direction at the magnetic field center of the main suspension magnet is disposed.

For example, in an embodiment, two auxiliary strip magnets are disposed on the microprojector or the counterweight; and respective axial lines of the two auxiliary strip magnets are on the same plane.

For example, in an embodiment, a connecting line of S poles of the two auxiliary strip magnets and a connecting line of N poles of the two auxiliary strip magnets are combined to form a first "cross" pattern; the four base magnets are uniformly distributed in the housing; connecting lines of two base magnets at a diagonal line are combined to form a second "cross" pattern; and centers of projections of the first "cross" pattern and the second "cross" pattern at the bottom of the magnetic suspension base are overlapped, and branches of the two "cross" patterns point at the same direction.

For example, in an embodiment, the number of the auxiliary magnets disposed on the microprojector or the counterweight is equal to the number of the base magnets.

For example, in an embodiment, all the base magnets are electromagnets.

For example, in an embodiment, the magnetic suspension base further comprises an electromagnet control unit. The electromagnet control unit comprises a power module and a control module; the power module is respectively connected with the electromagnets and the control module and configured to provide electric power, and the control module is configured to control the current output of the power module to the electromagnets.

For example, in an embodiment, the electromagnet control unit further comprises a monitoring module, the monitoring module is connected with the power module and the control module and configured to monitor suspension height and azimuth signals of the microprojection device and transmit the height and azimuth signals to the control module; and the control module is configured to adjust the height and azimuth of the microprojection device in real time according to the height and azimuth signals.

For example, in an embodiment, a top of the housing of the magnetic suspension base is provided with a cushion or made of a soft material; or the top of the housing comprises an opening and an inner bottom of the housing is provided with a cushion or made of a soft material.

For example, in an embodiment, a wireless charging receiver is disposed in the microprojector; and the magnetic suspension base further comprises a wireless charging emitter corresponding to the wireless charging receiver.

For example, in an embodiment, the wireless charging receiver is a resonant wireless charging receiver or a photo-electric sensing wireless charging receiver; and correspondingly, the wireless charging emitter is a resonant wireless charging emitter or a photo-electric sensing wireless charging emitter.

BRIEF DESCRIPTION OF THE DRAWINGS

Simple description will be given below to the accompanying drawings of the embodiments to provide a more clear understanding of the technical proposals of the embodiments of the present disclosure. It will be obvious to those skilled in the art that the drawings described below only involve some embodiments of the present disclosure but are not intended to limit the present disclosure.

FIG. 1b is a schematic structural view of a modification of the microprojection device as shown in FIG. 1a;

DETAILED DESCRIPTION

For more clear understanding of the objectives, technical proposals and advantages of the embodiments of the present disclosure, clear and complete description will be given below to the technical proposals of the embodiments of the present disclosure with reference to the accompanying drawings of the embodiments of the present disclosure. It will be obvious to those skilled in the art that the preferred embodiments are only partial embodiments of the present disclosure but not all the embodiments. All the other embodiments obtained by those skilled in the art without creative efforts on the basis of the embodiments of the present disclosure illustrated shall fall within the scope of protection of the present disclosure.

Figure 1A:
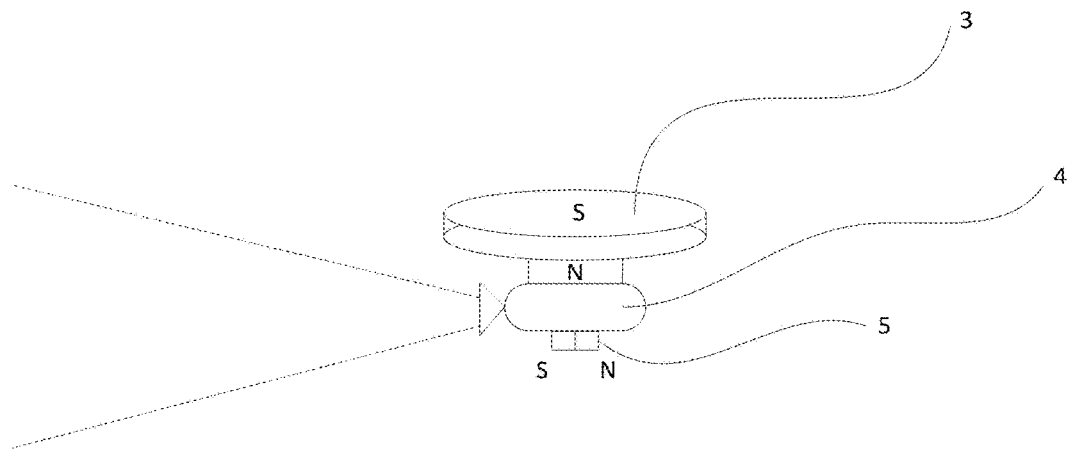
FIG. 1a is a schematic structural view of a microprojection device provided by one embodiment of the present disclosure.
Figure 1B:
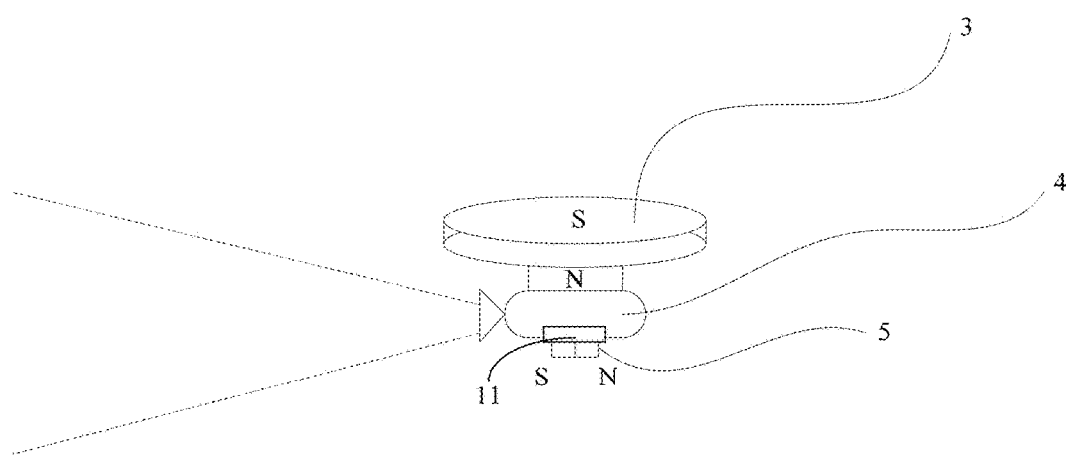

FIG. 1a and FIG. 1b are schematic structural views of a microprojection device provided by one embodiment of the present disclosure. As illustrated in FIG. 1a, the microprojection device comprises a microprojector 4 and, in order to suspend the microprojector 4, further comprises a main suspension magnet 3. The microprojector 4 is fixed to the main suspension magnet 3. The magnetic field direction at the magnetic field center of the main suspension magnet 3 is in the vertical direction, so that the microprojector 4 can be driven to be suspended under the magnetic field environment. The microprojector 4 may be a projection ring or a projector in other form.

For instance, a counterweight 11 may be further disposed under the main suspension magnet 3. As illustrated in FIG. 1b, the counterweight 11 may be similar to a weight for a balance scale. Different counterweights may be disposed according to actual condition (different magnetic intensities of the magnetic field environment). Of course, if the microprojector 4 has suitable mass, the microprojector 4 may be taken as a counterweight.

The microprojector 4 not only is kept stable in the vertical direction but also achieves stable orientation in the horizontal direction, so that projected images can be kept stable for a viewer. For instance, at least one auxiliary magnet 5 is also disposed on the microprojector 4 or the counterweight 11. The straight line in which the magnetic field direction at a magnetic field center of each auxiliary magnet 5 is disposed is perpendicular to the straight line in which the magnetic field direction at the magnetic field center of the main suspension magnet 3 is formed. Thus, under the magnetic field environment, when the main suspension magnet 3 is applied with a magnetic force in the vertical direction, so that the microprojector 4 can be kept suspended, the auxiliary magnets 5 each are applied with a magnetic force in the horizontal direction, so that the microprojector 4 can maintain stable orientation.

For instance, the microprojector 4 may also have a built-in wireless or non-contact type charging receiver. Thus, the microprojector 4 can be wirelessly charged even in the suspended state, so as to guarantee an enough battery life.

The microprojection device provided by at least one embodiment of the present disclosure can also suspend the microprojector in a magnetic field environment applying a repulse force to the suspension magnet 3. The magnetic field may be a magnetic field environment of a magnetic suspension base provided by the following embodiment.

Figure 2:
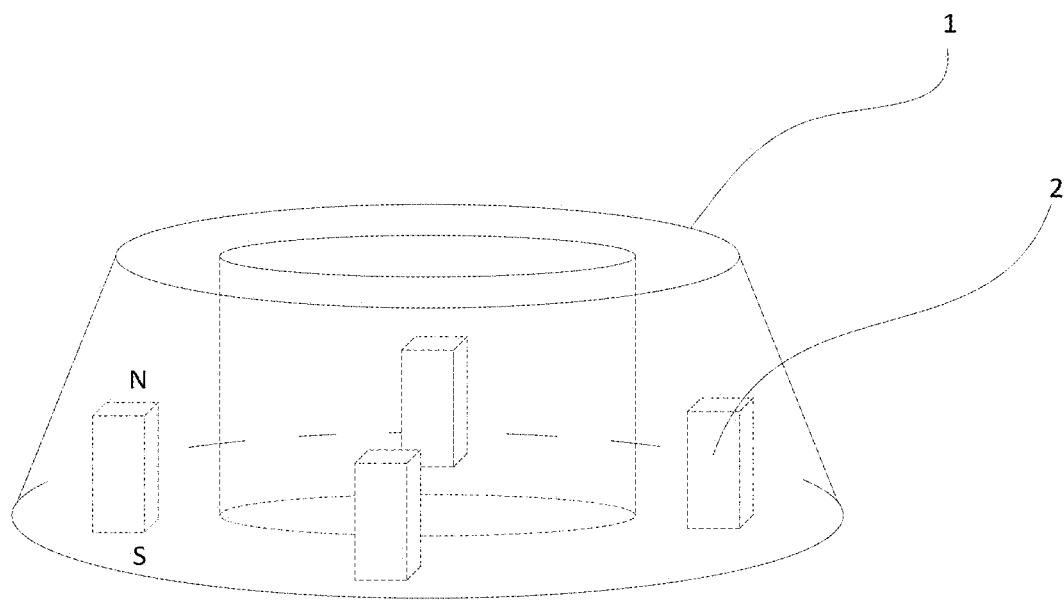
FIG. 2 is a schematic structural view of a magnetic suspension base provided by one embodiment of the present disclosure.

At least one embodiment of the present disclosure further provides a magnetic suspension base. As illustrated in FIG. 2, the magnetic suspension base comprises: a housing 1 and at least three base magnets 2 disposed within the housing 1. The magnetic field direction at the center of the combined magnetic field formed by the at least three base magnets 2 is in the vertical direction, and the magnetic intensity at the center of the combined magnetic field is less than the magnetic intensity of the combined magnetic field around the base magnets (that is to say, in the combined magnetic field, the magnetic intensity close to the center of the combined magnetic field is less than the magnetic intensity close to any base magnet 2), so that the microprojection device provided by any foregoing embodiment can be driven to be suspended. As the magnetic intensity is reduced as the magnetic field is away from the magnet, the overlap among at least three magnetic fields will form the combined magnetic field in which the center is weak and a position above each magnet is strong. That is to say, the combined magnetic field will provide a repulsive force that is upwards in the vertical direction to the main suspension magnet 3 of the microprojection device to overcome the gravity of the entire microprojection device, and then the microprojection device can be driven to be suspended. As illustrated in FIG. 2, the housing 1 is in the shape of a round platform. But the embodiments of the present disclosure are not limited thereto.

For instance, all the base magnets 2 may be uniformly disposed in the housing 1 so as to provide a uniform combined magnetic field. That is to say, a composite force of the main suspension magnet 3 applied by the combined magnetic field is about 0 in the horizontal direction, so that the microprojection device cannot be inclined.

FIG. 2 only illustrates the example in which four base magnets 2 are disposed within the housing 1. The four base magnets 2 may be uniformly distributed at the bottom of the housing 1, and of course, may also be fixed on the side wall of the housing 1. The disclosure of the present disclosure is not limited thereto.

Figure 3:
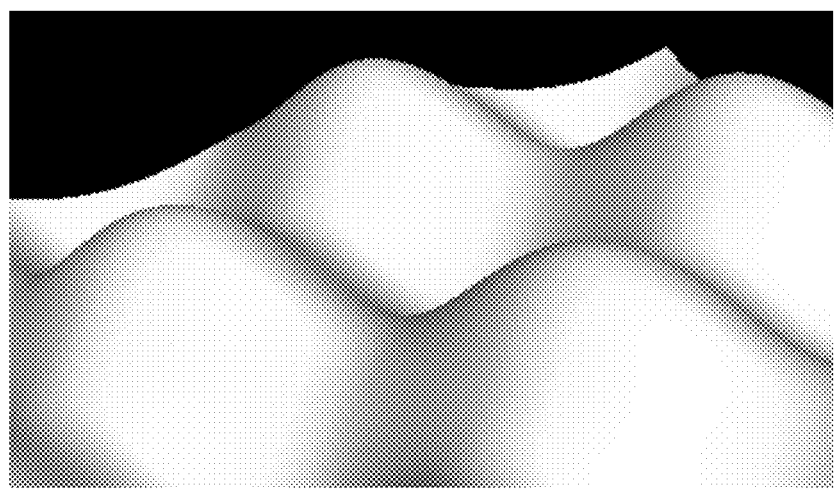
FIG. 3 is a schematic diagram illustrating the shape of a magnetic field formed by the magnetic suspension base as shown in FIG. 2.

As illustrated in FIG. 2, all the base magnets 2 are in the shape of strips. Poles of each strip base magnet 2 point at the same direction. In FIG. 2, north (N) poles are all pointed upwards. Alternatively, south (S) poles may also be all pointed upwards. FIG. 3 illustrates the configuration of a magnetic field formed by the four strip base magnets 2. The overlap of respective magnetic fields of the four strip base magnets 2 will form a combined magnetic field in which the intensity of the center of a circular ring is weak but the intensity of positions above the four magnets is strong.

Figure 4:
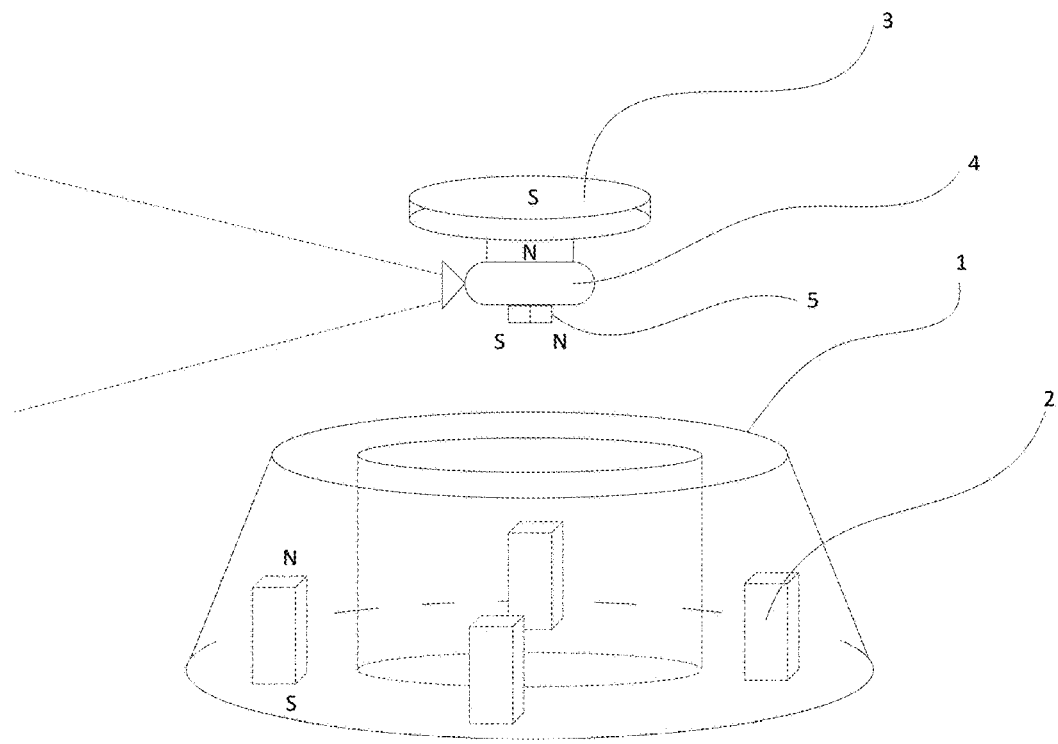
FIG. 4 is a schematic diagram illustrating the state when the microprojection device as shown in FIG. 1 is suspended over the magnetic suspension base as shown in FIG. 2.
Figure 5:
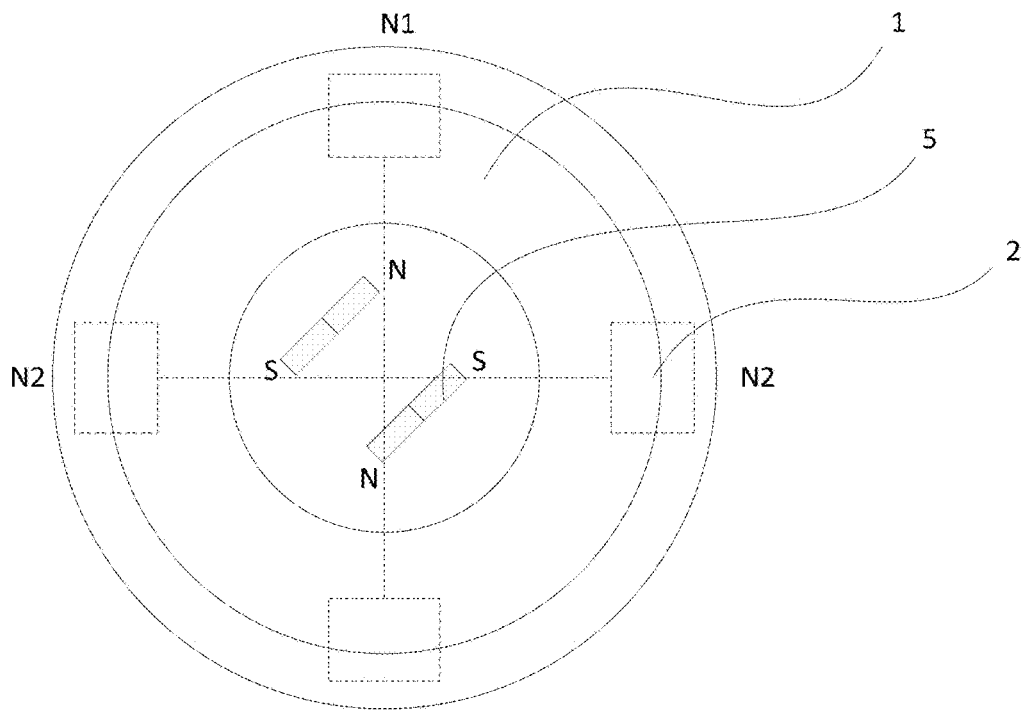
FIG. 5 is a diagram illustrating the position relation between auxiliary magnets of the microprojection device and the base magnets of the magnetic suspension base.

FIGS. 4 and 5 illustrate the state when the microprojection device is suspended over the magnetic suspension base. The S-N pole orientation of the main suspension magnet 3 is opposite to the S-N pole orientation of the base magnets 2 in the base. As illustrated in FIG. 4, the N poles of the main suspension magnet 3 are pointed downwards and the S poles of the main suspension magnet 3 are pointed upwards; the N poles of the base magnets 2 are pointed upwards and the S poles of the base magnets 2 are pointed downwards; and hence the main suspension magnet 3 can be suspended in the air.

As illustrated in FIGS. 4 and 5, two auxiliary strip magnets 5 are disposed on the microprojector 4, and axial lines of the two auxiliary strip magnets 5 are on the same plane. In order to keep the microprojector 4 stable in the horizontal direction, the connecting line of the S poles of the two auxiliary strip magnets and the connecting line of the N poles of the two auxiliary strip magnets are combined to form a first "cross" (+) pattern; the four base magnets are uniformly distributed in the housing; the connecting lines of two base magnets at a diagonal line are combined to form a second "cross" pattern; the centers of projections of the first "cross" pattern and the second "cross" pattern on the bottom of the magnetic suspension base are mutually overlapped; and branches of the two "cross" patterns point to same direction.

For instance, as illustrated in FIG. 5, the magnetic intensity N1 of the base magnets 2 disposed at both ends of a vertical y direction of the crossed pattern is less than the magnetic intensity N2 of the base magnets 2 disposed at both ends of a horizontal x direction of the crossed pattern, so that both ends in the vertical direction have small repulse force to the N poles of the auxiliary magnets 5 and both ends in the horizontal direction have large repulse force to the N poles of the auxiliary magnets 5 and have a large attractive force to the S poles of the auxiliary magnets 5, and hence the auxiliary magnets 5 can maintain stable orientation. Because the auxiliary magnets 5 are stable, the microprojector 4 can maintain good horizontal orientation and thus projected images can be kept stable. Compared with the example in which only one auxiliary magnet 5 is applied, the magnetic field in the example of two auxiliary magnets 5 can become more easily stabilized. A plurality of auxiliary magnets 5 may also be disposed. For instance, the number of the auxiliary magnets 5 is equal to the number of the base magnets in the base. Thus, each base magnet 2 is matched with one auxiliary magnet 5, so as to maintain good horizontal orientation.

The base magnets 2 may be all common permanent magnets (the suspension height may be adjusted by the counterweight on the microprojection device). In another example, the base magnets 2 may be all electromagnets. In this case, the magnetic force of the electromagnets can be respectively adjusted, so that the suspension height of the microprojection device can be more flexibly adjusted.

Figure 6:
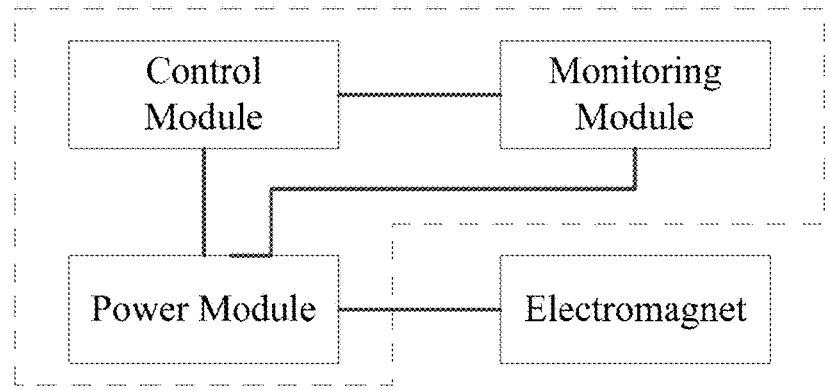
FIG. 6 is a schematic structural view of an electromagnet control unit for controlling electromagnets in the magnetic suspension base.

For instance, the magnetic suspension base may further comprise an electromagnet control unit. As illustrated in FIG. 6 (for example specifically shown by a portion represented by dotted lines), the electromagnet control unit comprises: a power module and a control module. The power module is respectively connected with the electromagnets and the control module. The control module is configured to control the current output of the power module to the electromagnets. Adjusting parameters, e.g., the current of the electromagnets corresponding to the suspension height and azimuth of the microprojector, may be preset in the control module.

For instance, the electromagnet control unit may further comprise a monitoring module, and this monitoring module is connected with the power module and the control module and configured to monitor the suspension height and azimuth signals of the microprojector and transmit the height and azimuth signals to the control module, and hence the control module adjusts the height and azimuth of the microprojection device in real time according to the height and azimuth signals. For instance, the control module may employ various control algorithms such as proportional-integral-derivative (PID) algorithm and fuzzy control algorithm to achieve the rapid stabilization of the microprojector. The monitoring module, for instance, may be a magnetic field distribution sensor configured to monitor the magnetic field distribution of the auxiliary magnets 5. The monitoring module may also be a camera configured to capture a distinct mark on a suspended object (a projection ring), and hence the control module determines the orientation of the suspended object through image algorithm or recognition. When the microprojection device is used, a user only needs to place the microprojection device at a substantially central position over the base, and hence the microprojection device can rapidly achieve the stabilization of height and orientation. For instance, the electromagnet control unit may be integrated into the base so as to obtain a compact structure and achieve a stable effect.

The power module is configured to provide electric power to the electromagnets, the monitoring module and the control module. The power module may be externally connected with other power source, built-in batteries or the like.

For instance, the top of the housing 1 of the magnetic suspension base is provided with a cushion or made of a soft material, so as to prevent the microprojection device from falling down and being damaged when the magnetic field is eliminated in the case of sudden power failure. The top of the housing 1 may also be an opening, namely there is no top. In this case, the inner bottom of the housing is provided with a cushion or made of a soft material.

Figure 7:
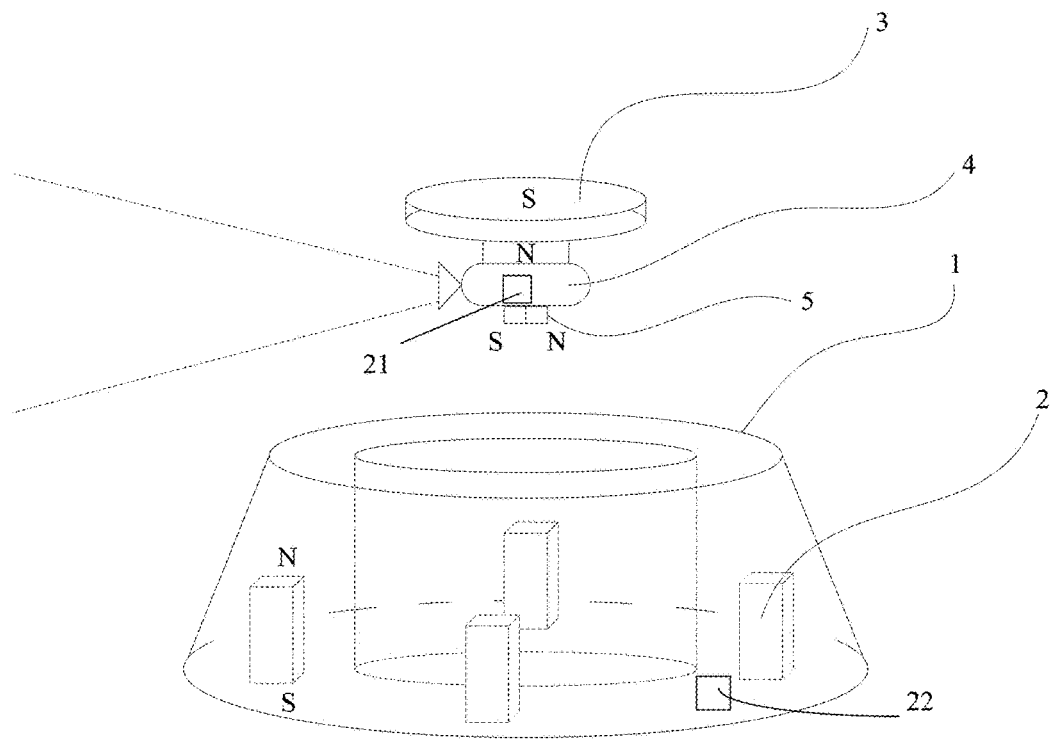
FIG. 7 is a schematic diagram illustrating the state when a microprojection device provided by another embodiment of the present disclosure is suspended over the magnetic suspension base.

For instance, as illustrated in FIG. 7, the microprojector may be provided with a wireless charging receiver 21, and the magnetic suspension base may further comprise a wireless charging emitter 22 corresponding to the receiver. Thus, the microprojector 4 can also be wirelessly charged in the case of suspension, so as to guarantee enough battery life. For instance, the wireless charging receiver is a resonant wireless charging receiver or a photo-electric sensing wireless charging receiver, and correspondingly, the wireless charging emitter may be a resonant wireless charging emitter or a photo-electric sensing wireless charging emitter. As the working frequency of resonant and photo-electric sensing wireless charging is larger than the mechanical resonance frequency of the microprojector, the influence of the magnetic field fluctuation on the projection display effect can be avoided.

It should be noted that all the magnets in the embodiment of the present disclosure may be strip magnets or may be circular (or loop) magnets. For instance, the main suspension magnet 3 may be made to be in a loop shape as long as the orientation of the magnetic field thereof is along the axial line of the loop. The overall shape of the housing of the magnetic suspension base may be of various shape to achieve a stable effect, for instance, may be the shape of a volcano, an ashtray, a flying saucer or the like. The suspension means of the microprojection device is also not limited to the suspension mode in the embodiment, in which the magnetic suspension base is disposed below and the microprojection device is disposed above, and may also be in the suspension mode in which the magnetic suspension base is fixed above, e.g., on the ceiling and the microprojection device is disposed below the base, as long as the base magnets of the magnetic suspension base and the main suspension magnet of the microprojection device attract each other. The principle thereof is similar to that of the above embodiments. No further description will be given here.

The foregoing is only the preferred embodiments of the present disclosure and not intended to limit the scope of protection of the present disclosure. The scope of protection of the present disclosure should be defined by the appended claims.

What is claimed is:

1. A magnetic suspension base, comprising: a housing and only four base magnets disposed in the housing,
   wherein
   the housing is in a shape of hollow circular truncated cone, and comprises an upper surface, a lower surface, an inner surface and an outer surface, the inner surface is an cylindrical surface perpendicular to the upper surface and the lower surface, the upper surface is in a shape of circular ring;
   the only four base magnets are spaced apart from each other, north poles of the only four base magnets point at a same direction, and distances between centers of orthographic projections of the only four base magnets on the lower surface and a center of the lower surface are same;
   a magnetic field direction of a center of a combined magnetic field formed by the only four base magnets is in a vertical direction; and
   magnetic intensity at the center of the combined magnetic field is less than magnetic intensity of the combined magnetic field near the base magnets.

2. The magnetic suspension base according to claim 1, wherein all the base magnets are uniformly arranged in the housing.

3. The magnetic suspension base according to claim 1, wherein all the base magnets are electromagnets.

4. The magnetic suspension base according to claim 3, further comprising an electromagnet control unit,
   wherein the electromagnet control unit comprises a power module and a control module; the power module is respectively connected with the electromagnets and the control module and configured to provide electric power, and the control module is configured to control a current output of the power module to the electromagnets.

5. The magnetic suspension base according to claim 3, wherein
   an inner bottom of the housing is provided with a cushion or made of a soft material.

6. The magnetic suspension base according to claim 1, wherein the magnetic suspension base further comprises a wireless charging emitter.

7. The magnetic suspension base according to claim 6, wherein
   the wireless charging emitter is a resonant wireless charging emitter or a photo-electric sensing wireless charging emitter.

8. The magnetic suspension base according to claim 1, wherein
   each base magnet is in a shape of cuboid; and
   a length of a side, which is perpendicular to the lower surface, of the cuboid is longer than a length of a side, which is parallel to the lower surface, of the cuboid.

* * * * *